United States Patent [19]

Zetterlund

[11] Patent Number: 5,134,088
[45] Date of Patent: Jul. 28, 1992

[54] PRECISION RESISTOR IN SELF-ALIGNED SILICIDED MOS PROCESS

[75] Inventor: Bjorn K. A. Zetterlund, Marlborough, Mass.

[73] Assignee: Digital Equipment Corporation, Maynard, Mass.

[21] Appl. No.: 515,854

[22] Filed: Apr. 27, 1990

[51] Int. Cl.⁵ ............................................. H01L 21/70
[52] U.S. Cl. ........................................ 437/60; 437/51; 437/57; 437/918; 437/47
[58] Field of Search ............... 437/60, 57, 918, 47; 357/51

[56] References Cited

U.S. PATENT DOCUMENTS

| | | | |
|---|---|---|---|
| 3,865,649 | 2/1975 | Beasom | 437/60 |
| 4,057,894 | 11/1977 | Khajezadeh et al. | 437/60 |
| 4,110,776 | 8/1978 | Rao et al. | 357/23 |
| 4,208,781 | 6/1980 | Rao et al. | 29/577 |
| 4,212,083 | 7/1980 | Rao | 365/154 |
| 4,246,692 | 1/1981 | Rao | 29/571 |
| 4,256,515 | 3/1981 | Miles et al. | 437/60 |
| 4,291,328 | 9/1981 | Lien et al. | 357/59 |
| 4,367,580 | 1/1983 | Guterman | 437/60 |
| 4,370,798 | 2/1983 | Lien et al. | 29/576 B |
| 4,408,385 | 10/1983 | Rao et al. | 29/576 B |
| 4,416,049 | 11/1983 | McElroy | 29/571 |
| 4,455,737 | 6/1984 | Godejahn | 29/571 |
| 4,599,789 | 7/1986 | Gasner | 437/57 |
| 4,734,382 | 3/1988 | Krishna | 437/47 |

FOREIGN PATENT DOCUMENTS

32762 4/1981 Japan ........................... 437/918

*Primary Examiner*—Brian E. Hearn
*Assistant Examiner*—Linda J. Fleck
*Attorney, Agent, or Firm*—Arnold, White & Durkee

[57] ABSTRACT

A precision resistor is formed in an integrated circuit by a diffused region created at the same time as transistor source/drain regions. In a CMOS process, this N-type resistor region is formed in an N-well, as is used for P-channel transistors. The resistor formed using a deposited oxide layer as a mask, and this oxide layer is also used to create sidewall spacers for the transistor gates. The sidewall spacers are used in creating self-aligned silicided areas over the source/drain regions, self-aligned with the gates, and the silicide is also used for contact areas for the resistor. The value of the resistor is defined by the width of the deposited oxide layer left as a mask, but this does not require any critical alignment steps.

15 Claims, 6 Drawing Sheets

PRECISION RESISTOR IN SELF-ALIGNED SILICIDED MOS PROCESS

BACKGROUND OF THE INVENTION

This invention relates to semiconductor devices, and more particularly to a method of forming precision resistors compatible with a self-aligned silicided CMOS process for making integrated circuits.

In high-performance, high-speed integrated circuit devices the signal paths between integrated circuit chips are effectively transmission lines. The impedances of the input and output circuits at the chip are different from the impedances of the signal paths, which causes reflections and degrade the signal. On-chip resistors to match the resistance on the chip with that of the signal path are the most effective way of reducing these signal-degrading reflections. For proper matching, the resistors preferably have selected values in the 10–50 ohm range with tolerances of +/−10% (3 sigma). In MOS integrated circuits made by commercial processes, these resistance and tolerance requirements are best met by using resistors formed by N+ diffusions.

Resistors are formed in integrated circuit devices by making use of a diffused region of the proper length, width and impurity concentration to give the necessary resistance. In prior devices, the diffused regions creating the resistors are formed at the same time as source/drain regions in MOS integrated circuits. In contemporary CMOS processes using self-aligned silicided source/drain regions, however, the resistors cannot be created by previous methods without introducing unduly burdensome additional process steps, and these may have required critical alignments.

Various other methods for making resistors elements in integrated circuits have been proposed. For example, resistors may be formed in first-level or second-level polysilicon layers as set forth in U.S. Pat. Nos. 4,110,776, 4,209,716, 4,291,328 or 4,416,049. Alternatively, resistor elements may be formed by implanted regions buried under field oxide as set forth in U.S. Pat. No. 4,212,083. These prior methods are not suitable for the present purposes, however, due to the additional process steps needed, or deficiencies in the values or tolerances of the resistors, or their temperature coefficient of resistance, or other characteristics.

SUMMARY OF THE INVENTION

In accordance with one embodiment of the invention, a precision resistor is formed in an integrated circuit by a diffused region created at the same time as transistor source/drain regions. In a CMOS process, this N-type resistor region is formed in an N-well, as is used for P-channel transistors. The resistor is formed using a deposited oxide layer as a mask, and this oxide layer is also used to create sidewall spacers for the transistor gates. The sidewall spacers are used in creating self-aligned silicided areas over the source/drain regions, self-aligned with the gates, and the silicide is also used for contact areas for the resistor. The value of the resistor is defined by the width of the deposited oxide layer left as a mask, but this does not require any critical alignment steps. A standard process for making CMOS integrated circuits having self-aligned silicided source/drain areas may be used, with the addition of only one non-critical masking step to define the size of the deposited oxide area where the resistor is to be created.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 1 is an elevation view in section of a small part of a semiconductor integrated circuit containing a precision resistor according to one embodiment of the invention, along with other components, taken along the line 1—1 of FIG. 1a;

FIG. 7 is an elevation view in section of a small part of a semiconductor integrated circuit containing a precision resistor according to another embodiment of the invention, taken along the line 7—7 of FIG. 7a.

DETAILED DESCRIPTION OF SPECIFIC EMBODIMENT

Figure 1:
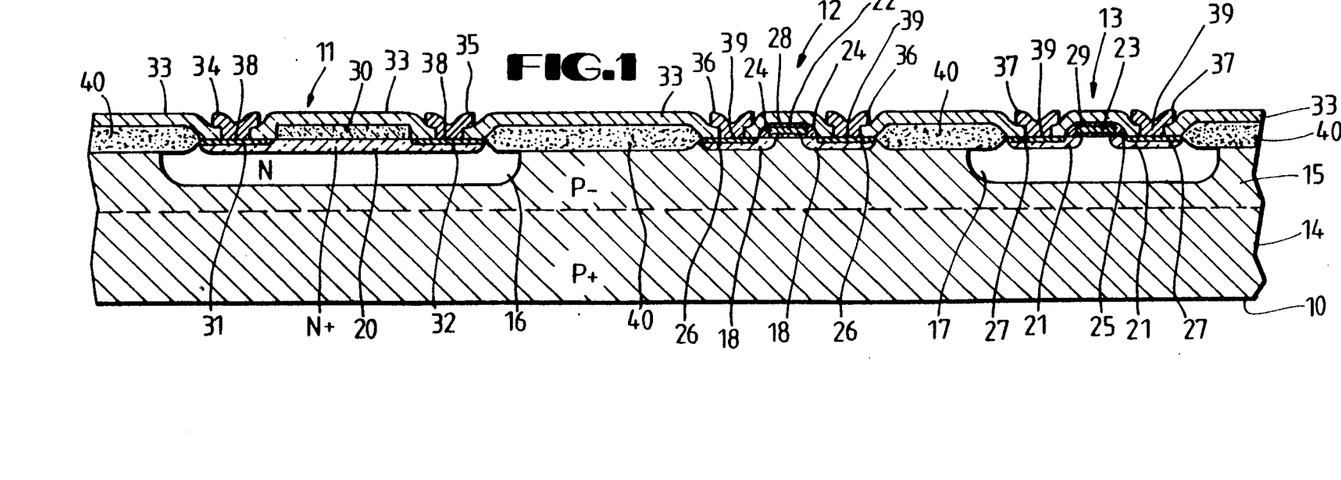
Figure 1A:
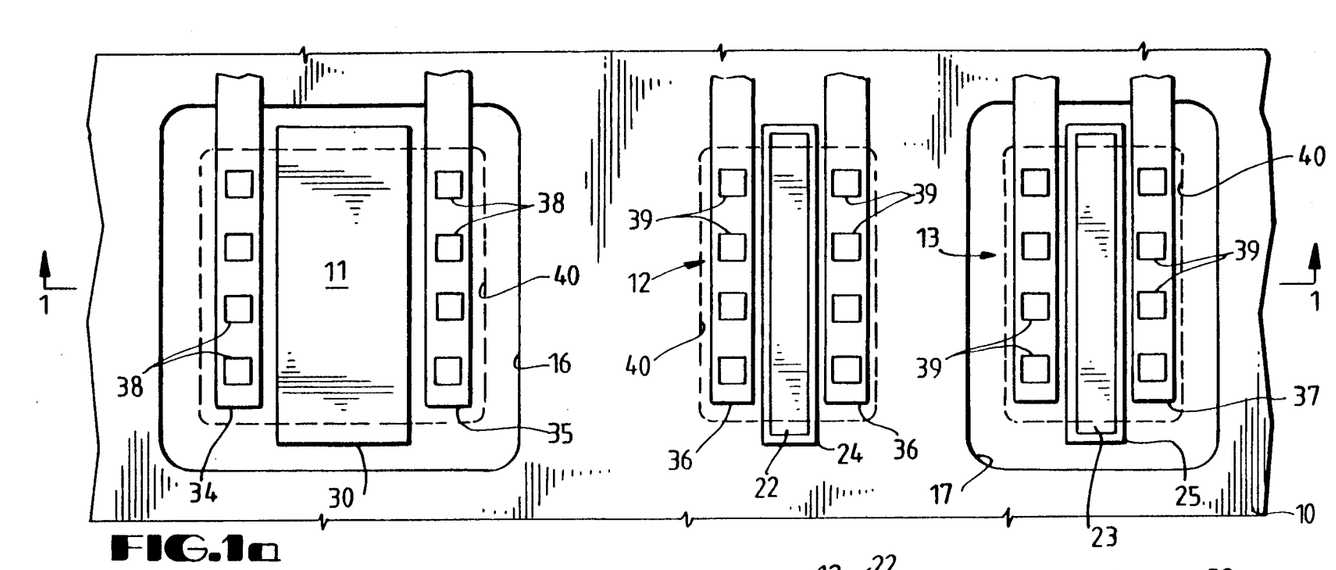
FIG. 1a is a plan view of the device of FIG. 1.

Referring to FIGS. 1 and 1a, a semiconductor chip 10 is shown having a precision resistor 11 constructed according to the invention in a CMOS device having an N-channel transistor 12 and a P-channel transistor 13. The chip includes a P+ substrate 14 with a P-epitaxial layer 15, and the resistor 11 and the P-channel transistor 13 are formed in separate N-wells 16 and 17. Source and drain regions 18 for the N-channel transistor 12 are created by an N+ implant which is driven into the P-epi layer 15 to form shallow N+ areas; this same N+ implant into the N-well 16 is used to create the N-type resistive area 20 of the precision resistor 11, according to a feature of one embodiment of the invention. Source and drain regions 21 for the P-channel transistor 13 are created by a P+ implant which is driven into the N-well 17 to form shallow P+ areas. Gates 22 and 23 for the transistors 12 and 13 are polysilicon electrodes overlying thin gate oxide and overlying channel regions between the source/drain regions, with the source/drain regions self-aligned with the gates. Sidewall spacers 24 and 25 are used on the sides of the polysilicon gates 22 and 23 to provide a self-alignment feature in creating silicided areas 26 and 27 on the source/drain regions 18 and 21. Silicided areas 28 and 29 are also created on top of the polysilicon gates 22 and 23. According to a feature of one embodiment of the invention, an oxide layer 30 on top of the resistor region 20 is created at the same time as the sidewall spacers 24 and 25, and self-aligned silicided regions 31 and 32 created at the same time as the silicided areas 26, 27, 28 and 29 provide contacts to the ends of the resistor region 20. A low-temperature deposited oxide layer 33 covers the entire face of the wafer after the silicided areas are formed, and vias etched in this oxide layer 33 allow metal-to-silicide contacts for connections 34 and 35 to both sides of the resistor 11, as well as source/drain connections 36 and 37 for the transistors 12 and 13, respectively. The metal connections 34–37 make contact to the silicided areas at contact areas 38 or 39.

The areas used for the precision resistor and the N- and P-channel transistors 12 and 13 are delineated on the face of the substrate by high-temperature (thermal) field oxide areas 40. There may be second (or third) level metallization, separated from the first level metal contacts and interconnections 34-37 by interlevel oxide, not shown.

Referring to FIGS. 2-6, a method for manufacturing the device of FIGS. 1 and 1a will be described. These FIGS. 2-6 are at successive stages in the manufacturing process. It is understood that only a very small part of a silicon wafer is shown in these Figures, and the transistors and resistor illustrated are merely examples of devices formed in dense circuits having perhaps hundreds of thousands of such components in each chip. There are usually hundreds of such chips in a wafer of perhaps six or eight inch diameter, before breaking into individual units.

Figure 2:
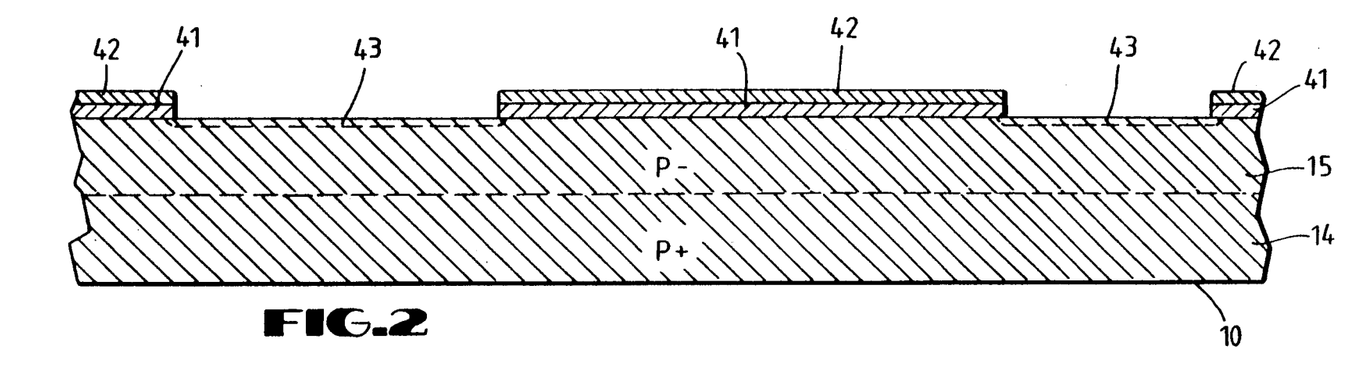
FIG. 2, 3, 4, 5 and 6 are elevation views in section of the device of FIGS. 1 and 1a at intermediate stages in the manufacture of a precision resistor according to one embodiment of the invention.
Figure 3:
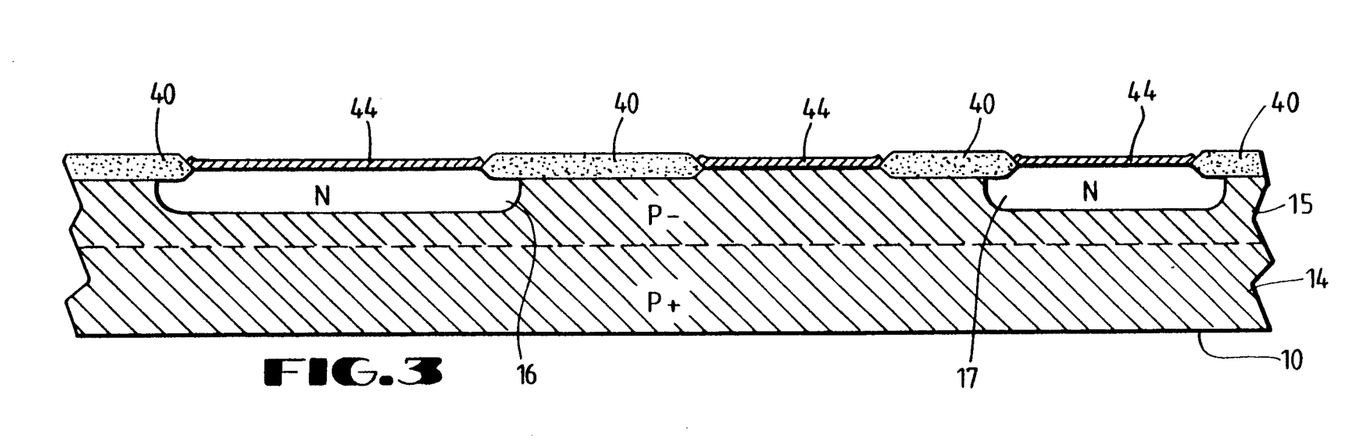
Figure 4:
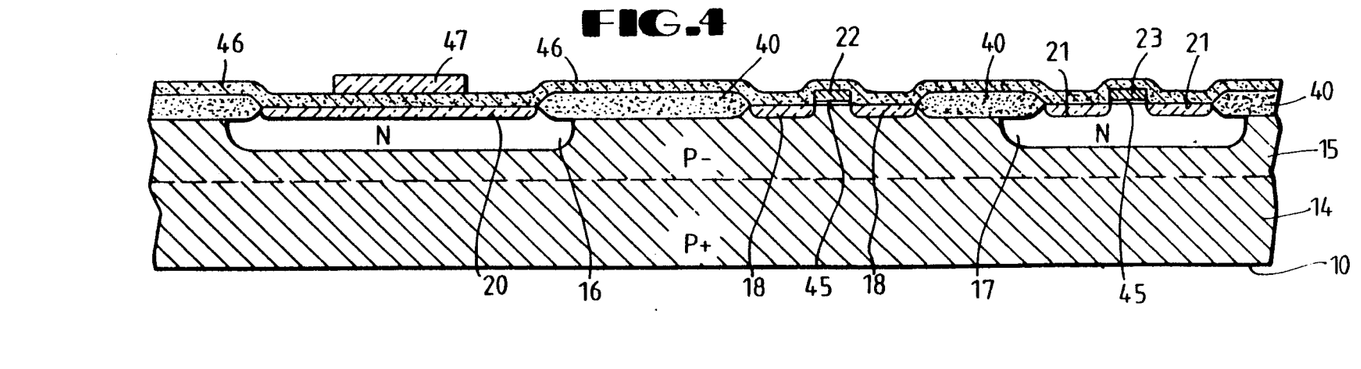
Figure 4A:
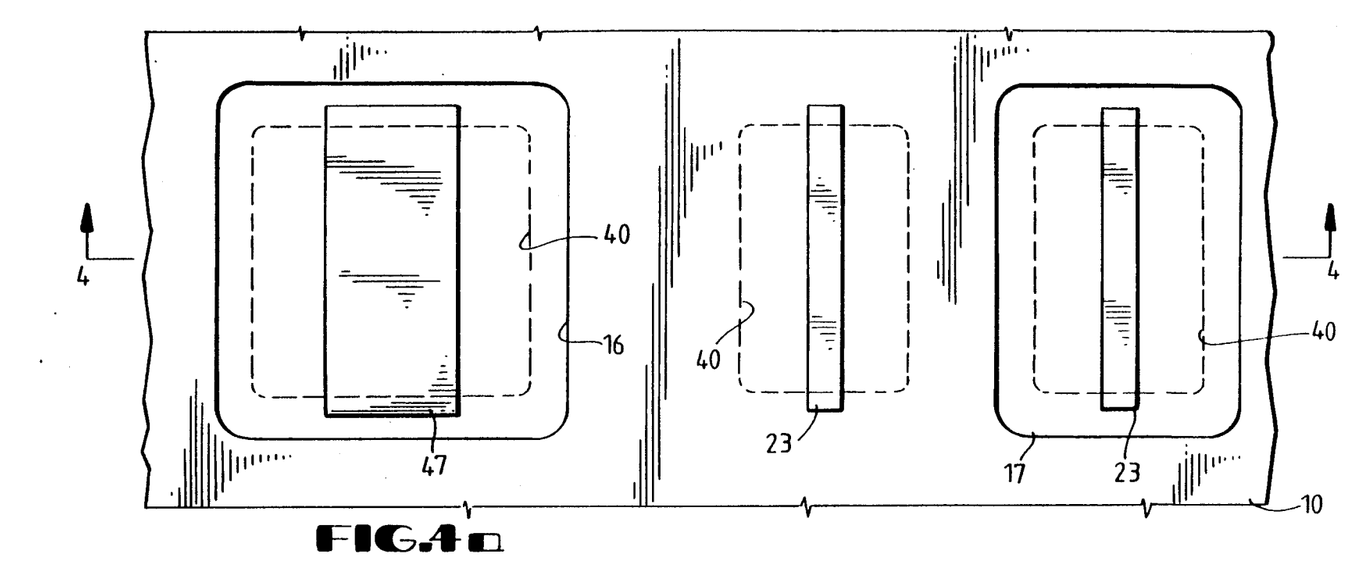
FIGS. 4a, 5a and 6a are plan views of the device of FIGS. 4, 5 and 6, respectively.
Figure 5:
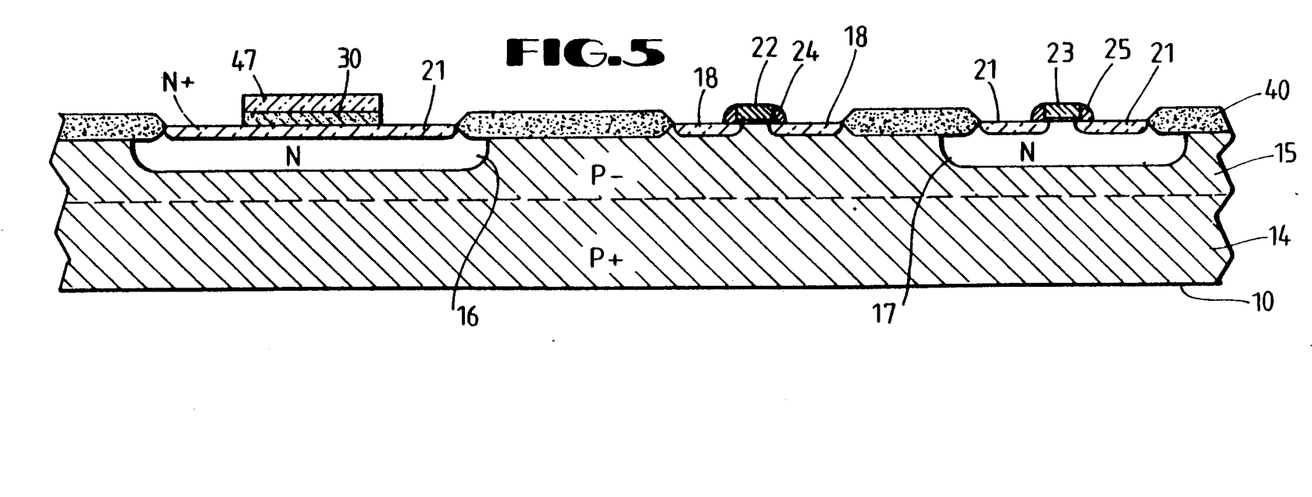
Figure 5A:
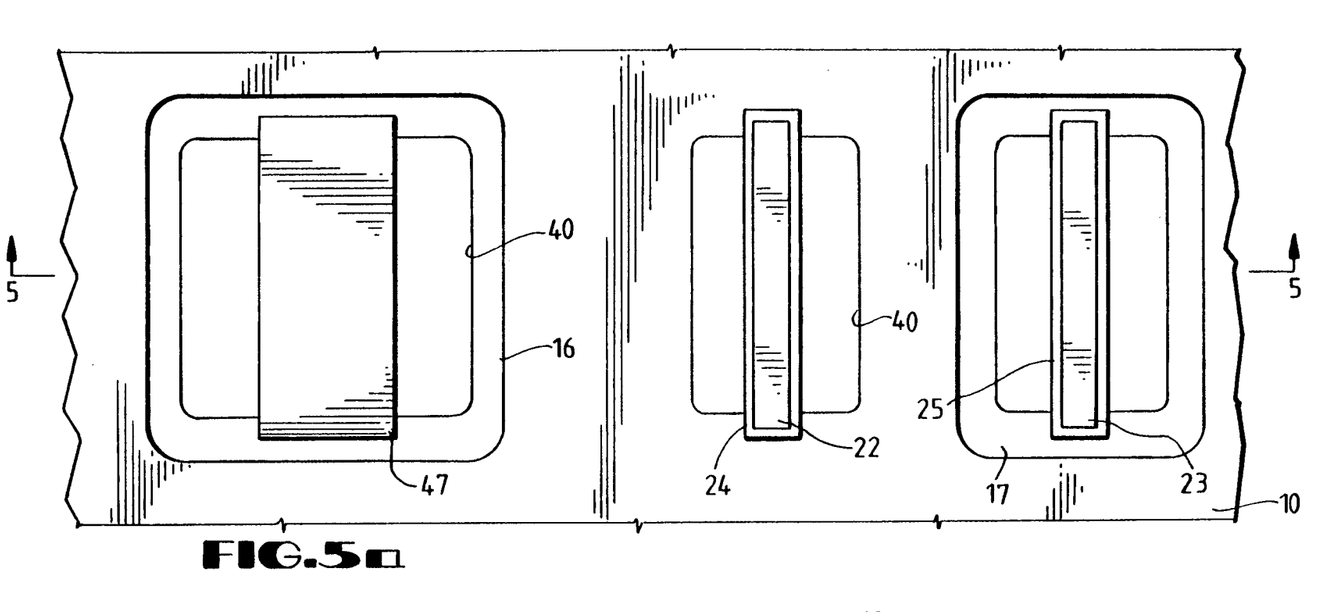
Figure 6:
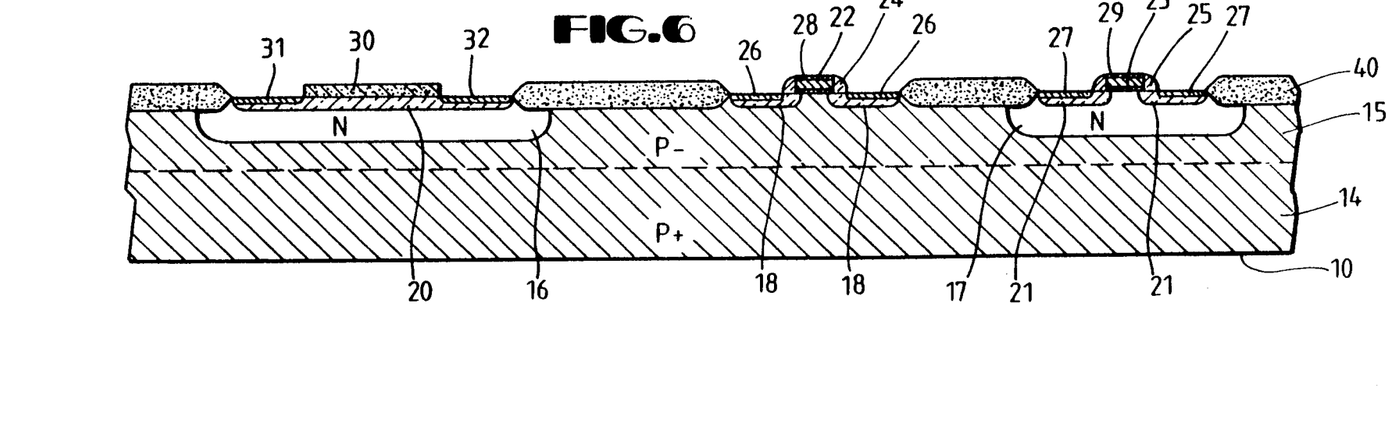
Figure 6A:
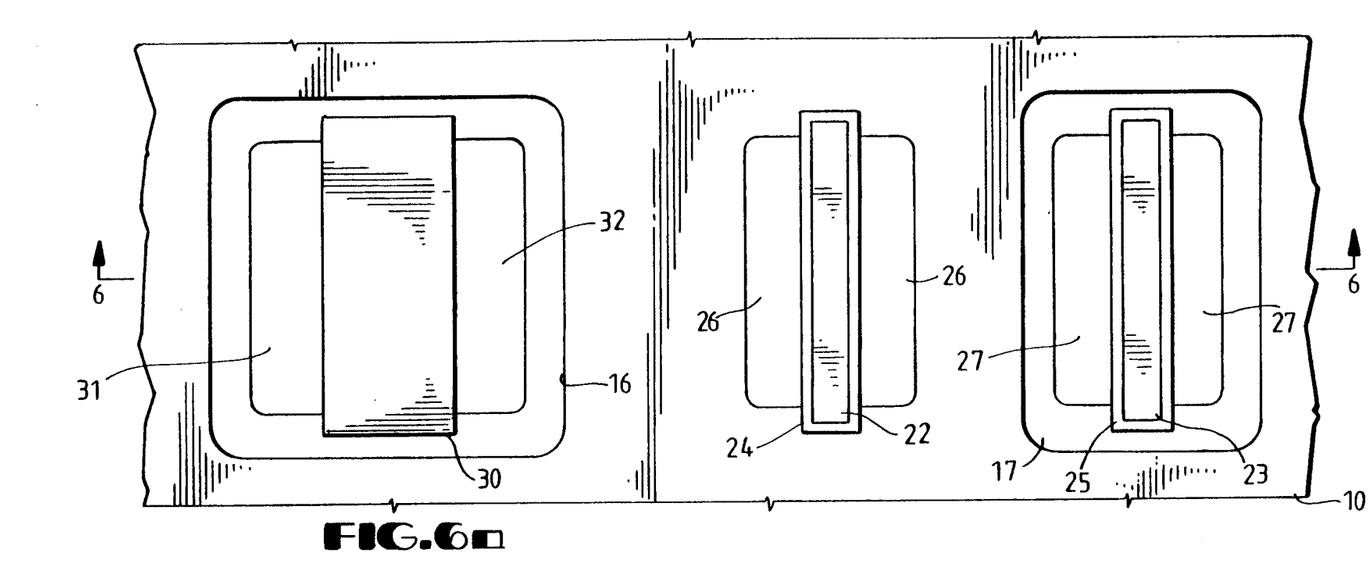

After a thermal oxidation step to create a layer 41 of silicon dioxide, a photoresist mask 42 is formed over the areas where N-channel transistors are to be created, as shown in FIG. 2. After an etching step to remove the silicon oxide layer 41 in the unmasked areas, a phosphorus implant is performed to create shallow regions 43 which, when driven into the silicon by subsequent high-temperature steps, create the N-wells 16 and 17, as seen in FIG. 3. The field oxide layer 40 is formed by first depositing a layer 44 of silicon nitride over a thin layer of oxide on the epi layer 15 as shown in FIG. 3, then patterning this oxide/nitride layer 44 using a photolithographic masking and etching step to leave oxide/nitride only where the transistors or resistor are to be created. The wafer is then subjected to a thermal oxidation step to form the field oxide 40 in areas where the oxide/nitride 44 has been removed. The oxide/nitride layer 44 is stripped off. The next step is forming the gate oxide 45, usually by thermal oxidation, then creating the gates 22 and 23 by depositing a layer of polycrystalline silicon over the entire face of the wafer and patterning the layer using photoresist masking and etching to leave only the gates 22 and 23 (as well as polysilicon interconnects) as seen in FIGS. 4 and 4a. The area of the P-channel transistor 13 is covered by a photoresist mask, and an arsenic implant is performed at this point, using the polysilicon gate 22 as a mask to create the N+ source/drain regions 18 and 21; at the same time, the resistor region 20 is formed by this implant. The photoresist mask is stripped, then the area of the resistor 11 and that of the N-channel transistor 12 are covered by another photoresist mask and a P+ implant done to create the source/drain regions 21 for the P-channel transistor 13. The face of the wafer is next covered with a conformal coating 46 of low-temperature deposited oxide to be used in creating the sidewall spacers 24 and 25. This oxide is also used to define the shape of the precision resistor 11, and to this end a mask 47 of photoresist is formed over the region 20 which is to become the resistor. This mask 47 is formed by depositing photoresist over the entire top surface of the oxide 46, then exposing to light through a mask prepared for solely the purpose of defining the resistor sizes. This photoresist mask and etch step (and subsequent removal of the mask 47) is the only manufacturing step added to a standard CMOS process to produce the resistors of the invention, since all of the other steps in this method are already present in an N-well CMOS process using sidewall spacers and self-aligned silicided source/drain regions. These added steps, forming the mask 47 and then removing this mask, require no critical alignment with other geometry of the face of the wafer to define the resistor value, since the resistor value will be determined by the width of the mask 47 (for a given resistivity of the diffused region 20). A directional etch such as a reactive ion etch is used to remove all of the deposited oxide layer 46 in the areas of the face not covered by the mask 47, but since only a given amount of oxide is removed in this step the sidewall spacers 24 and 25 are left where the thickness has built up near the vertical step of the polysilicon gates 22 and 23, seen in FIGS. 5 and 5a. The next step is forming the silicided areas 26, 27, 28, 29, 31 and 32, as seen in FIG. 6, and this is accomplished by first stripping off the mask 47 then depositing a thin layer of cobalt or other such metal over the entire top surface of the wafer, followed by a heat treatment which forms the silicide by reaction of metal with the silicon where the silicon is bare; in areas covered by oxide the metal does not react and is subsequently removed by cleaning. The silicide thus forms on the tops of the polysilicon gates 22 and 23, and on the source/drain regions of the transistors, as well as defining the resistor 11 by low-resistance contacts areas on both sides of the oxide layer 30. After the self-aligned silicide areas are created, the entire top surface of the wafer is coated with the low-temperature deposited oxide 33 as seen in FIG. 1, and a photoresist masking and etching step is performed to open the vias where contact is to be made to the silicided areas at contact areas 38 and 39. The metallization layer for contacts and interconnects is then formed by first laying down a coating a metal, e.g., aluminum, and patterning this metal layer using photoresist masking and etching to leave the contacts 34, 35, 36 and 37, seen in FIGS. 1 and 1a.

Figure 7:
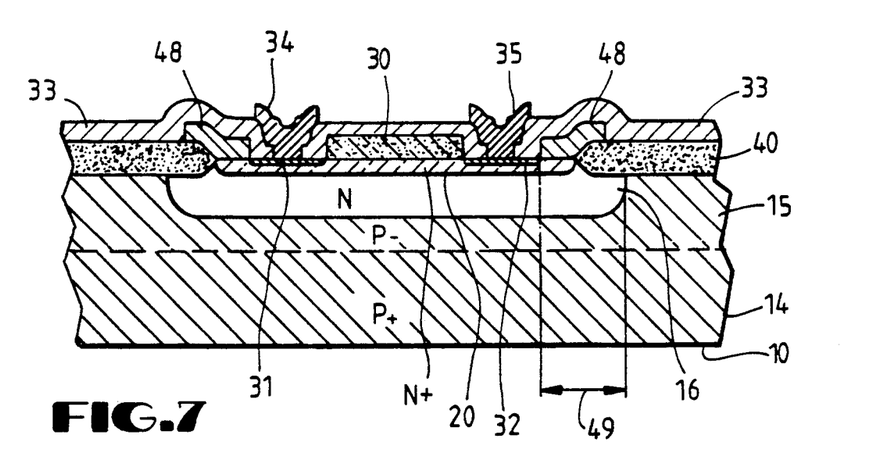
Figure 7A:
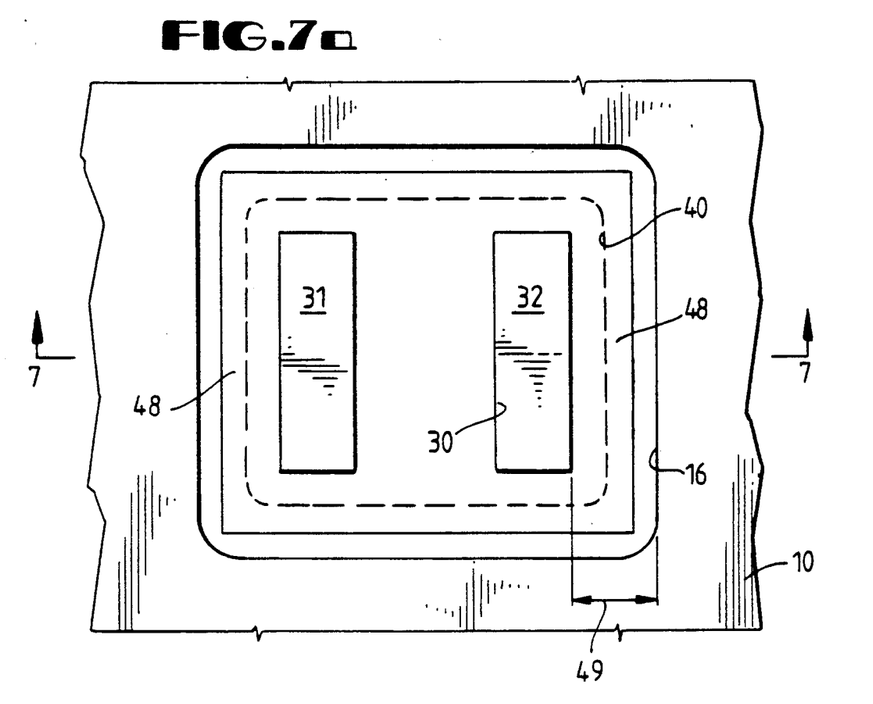
FIG. 7a is a plan view of the device of FIG. 7.

In another embodiment of the invention, as illustrated in FIGS. 7 and 7a, the low temperature deposited oxide layer used to create the region 30 of oxide to define the resistor size (and of course to create the sidewall spacers) may also be left in place in a frame-shaped area 48 surrounding the resistor, overlying all of the inner edge of the field oxide 40 on the wafer face and spacing the silicided area away from the field oxide 40. This configuration increases the distance 49 along the surface between the N+ diffused region just beneath the silicide and the P-epitaxial region 15 and thus allows the precision resistor to withstand higher electrostatic voltages. Other than the shape of the frame area 48 of the oxide layer around the resistor, the process of making the device of FIGS. 7 and 7a is the same as that of FIGS. 1-6.

The precision resistors described above are thus seen to be manufactured by a process compatible with a standard CMOS process, without adding any process steps requiring critical alignment. The magnitude of resistance produced is in the range needed for impedance matching, i.e., 10-50 ohms. Self-aligned silicided source/drain regions may be used for the N- and P-channel transistors in the CMOS integrated circuit, but the silicided areas need not be used for the resistors; the silicided areas have a sheet resistance many times lower than that of the diffused source/drain regions, and so cannot function as resistors of moderate value.

While this invention has been described with reference to specific embodiments, this description is not meant to be construed in a limiting sense. Various modifications of the disclosed embodiments, as well as other embodiments of the invention, will be apparent to persons skilled in the art upon reference to this description.

It is therefore contemplated that the appended claims will cover any such modifications or embodiments as fall within the true scope of the invention.

What is claimed is:

1. A method of making a resistor in the manufacture of integrated circuit devices, comprising the steps of:
   a) forming transistor gates in transistor areas at a face of a semiconductor body;
   b) depositing a conformal coating of oxide on said face;
   c) masking a resistor area of said face and exposing said transistor areas;
   d) etching said face in a directional manner to leave said oxide on said resistor area to leave sidewall spacers adjacent said gates in said transistor areas;
   e) simultaneously forming silicided areas on said face on opposite sides of said oxide on said resistor area, and on source/drain areas adjacent said sidewall spacers.

2. A method according to claim 1 including the step of introducing impurity into said face using transistor gates as a mask to create source/drain regions for said transistors and to create a resistor region beneath said resistor area.

3. A method according to claim 2 wherein said step of introducing impurity includes separate steps of introducing N-type and P-type impurity to thereby create both N-channel and P-channel transistors.

4. A method according to claim 1 wherein said step of masking said resistor area includes masking a frame area surrounding said resistor area.

5. A method according to claim 1 wherein said resistor area overlies an N-well in a P-type substrate.

6. A method of making an integrated circuit device, comprising the steps of:
   a) forming an N-well in a face of a silicon body at a first transistor area and another N-well in said face at a resistor area, and forming field oxide on said face;
   b) forming a first polysilicon transistor gate at said in said first transistor area and a second polysilicon transistor gate in a second transistor area surrounded by said field oxide;
   c) introducing impurity into said face using said first and second polysilicon transistor gates as masks to create source/drain regions in said first and second transistor areas and to create a resistor region in said N-well in said resistor area;
   d) depositing a conformal coating of silicon oxide on said face;
   e) masking a part of said resistor area;
   f) etching said oxide in a directional manner to leave said conformal coating of oxide on said part of said resistor area and to leave sidewall spacers adjacent said transistor gates;
   g) forming silicided areas on said face on opposite sides of said oxide on said resistor area, and on said source/drain regions adjacent said sidewall spacers.

7. A method according to claim 6 wherein said step of introducing impurity includes a step of introducing a P-type impurity to create a P-channel transistor in said N-well in said transistor area, and a separate step of introducing N-type impurity at said second transistor area.

8. A method of making an integrated circuit device, comprising the steps of:
   a) forming an N-well in a face of a silicon body at a first transistor area and another N-well in said face at a resistor area, and forming field oxide on said face;
   b) forming a first polysilicon transistor gate at said face in said first transistor area and a second polysilicon transistor gate in a second transistor area surrounded by said field oxide;
   c) introducing impurity into said face using said first and second polysilicon transistor gates as masks to create source/drain regions in said first and second transistor areas and to create a resistor region in said N-well in said resistor area; said step of introducing impurity including a step of introducing a P-type impurity to create a P-channel transistor in said N-well in said transistor area, and a separate step of introducing N-type impurity at said second transistor area; and wherein said step of introducing N-type impurity creates said resistor region;
   d) depositing a conformal coating of silicon oxide on said face;
   e) masking a part of said resistor area;
   f) etching said oxide in a directional manner to leave said conformal coating of oxide on said part of said resistor area and to leave sidewall spacers adjacent said transistor gates;
   g) forming silicided areas on said face on opposite sides of said oxide on said resistor area, and on said source/drain regions adjacent said sidewall spacers.

9. A method according to claim 6 wherein said step of masking said part of said resistor area includes also masking a frame area surrounding said resistor area, whereby said silicided areas on said resistor area are spaced from said field oxide.

10. A method according to claim 6 including the step of forming metal-to-semiconductor contacts on contact areas of said silicided areas.

11. A method of making a circuit device in the manufacture of integrated circuit devices, comprising the steps of:
   a) forming transistor gates in transistor areas at a face of a semiconductor body;
   b) depositing a conformal coating of oxide on said face;
   c) masking a selected area of said face spaced from said transistor areas, and exposing said transistor areas;
   d) etching said oxide in a directional manner using said masking to leave said oxide on said selected area and to leave sidewall spacers adjacent said gates in said transistor areas;
   e) simultaneously forming silicided areas on said face on opposite sides of said oxide on said selected area, and on source/drain areas adjacent said sidewall spacers.

12. A method according to claim 11 including the step of introducing impurity into said face using said transistor gates as a mask to create source/drain regions for transistors and to create a region beneath said selected area to provide a resistor device.

13. A method according to claim 12 wherein said step of introducing impurity includes separate steps of introducing N-type and P-type impurity to thereby create both N-channel and P-channel transistors.

14. A method according to claim 11 wherein said step of masking said selected area includes masking a frame area surrounding said selected area.

15. A method according to claim 11 wherein said selected area overlies an N-well in a P-type substrate.

* * * * *

UNITED STATES PATENT AND TRADEMARK OFFICE
CERTIFICATE OF CORRECTION

PATENT NO. : 5,134,088
DATED : July 28, 1992
INVENTOR(S) : Zetterlund

It is certified that error appears in the above-indentified patent and that said Letters Patent is hereby corrected as shown below:

Column 3, line 20, change "dioxide" to --oxide--.
Column 5, line 39, after "said" insert --face--.

Signed and Sealed this

Thirty-first Day of August, 1993

Attest:

BRUCE LEHMAN

*Attesting Officer*  *Commissioner of Patents and Trademarks*